(12) United States Patent
Chan et al.

(10) Patent No.: US 8,946,028 B2
(45) Date of Patent: Feb. 3, 2015

(54) MERGED FINFETS AND METHOD OF MANUFACTURING THE SAME

(75) Inventors: Kevin K. Chan, Staten Island, NY (US); Zhibin Ren, Hopewell Junction, NY (US); Xinhui Wang, Portland, OR (US); Keith Kwong Hon Wong, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 768 days.

(21) Appl. No.: 12/574,296

(22) Filed: Oct. 6, 2009

(65) Prior Publication Data
US 2011/0079855 A1 Apr. 7, 2011

(51) Int. Cl.
*H01L 21/336* (2006.01)
*H01L 29/417* (2006.01)
*H01L 29/66* (2006.01)
*H01L 29/78* (2006.01)

(52) U.S. Cl.
CPC .... *H01L 29/41791* (2013.01); *H01L 29/66795* (2013.01); *H01L 29/785* (2013.01); *H01L 2029/7858* (2013.01)
USPC .................................. 438/283; 257/E21.619

(58) Field of Classification Search
CPC ............ H01L 29/41791; H01L 29/785; H01L 29/66795; H01L 21/845; H01L 21/823431
USPC ........................... 257/E21.619; 438/283, 300
See application file for complete search history.

(56) References Cited

U.S. PATENT DOCUMENTS

| | | | | |
|---|---|---|---|---|
| 6,096,644 | A * | 8/2000 | Lukanc | 438/674 |
| 6,232,224 | B1 * | 5/2001 | Inoue | 438/639 |
| 6,420,784 | B2 * | 7/2002 | Hu et al. | 257/754 |
| 6,448,167 | B1 * | 9/2002 | Wang et al. | 438/595 |
| 6,867,433 | B2 * | 3/2005 | Yeo et al. | 257/67 |
| 6,960,479 | B2 * | 11/2005 | Li et al. | 438/386 |
| 7,112,495 | B2 | 9/2006 | Ko et al. | |
| 7,180,134 | B2 | 2/2007 | Yang et al. | |
| 7,279,375 | B2 * | 10/2007 | Radosavljevic et al. | 438/197 |
| 7,425,740 | B2 | 9/2008 | Liu et al. | |
| 7,456,471 | B2 | 11/2008 | Anderson et al. | |
| 7,608,890 | B2 * | 10/2009 | Yagishita | 257/347 |
| 7,612,416 | B2 * | 11/2009 | Takeuchi et al. | 257/377 |
| 2002/0000621 | A1 * | 1/2002 | Havemann | 257/384 |
| 2008/0042219 | A1 * | 2/2008 | Booth et al. | 257/401 |
| 2008/0124868 | A1 | 5/2008 | Nowak | |
| 2009/0001426 | A1 | 1/2009 | Cheng et al. | |
| 2009/0020819 | A1 | 1/2009 | Anderson et al. | |
| 2009/0101978 | A1 | 4/2009 | Anderson et al. | |

OTHER PUBLICATIONS

Choi et al., "Large Scale Integration and Reliability Consideration of Triple Gate Transistors", IEDM, vol. 647, © 2004, pp. 27.6.1-27.6.4.*

* cited by examiner

*Primary Examiner* — Stephen W Smoot
*Assistant Examiner* — Sun M Kim
(74) *Attorney, Agent, or Firm* — Joseph Abate; Roberts Mlotkowski Safran & Cole, P.C.

(57) ABSTRACT

FinFETs are merged together by a metal. The method of manufacturing the FinFETs include forming a plurality of fin bodies on a substrate and merging the fin bodies with a metal. The method further includes implanting source and drain regions through the metal.

18 Claims, 4 Drawing Sheets

US 8,946,028 B2

MERGED FINFETS AND METHOD OF MANUFACTURING THE SAME

FIELD OF THE INVENTION

The invention relates to FinFETs and a method manufacture, and more particularly, to FinFETs merged with a metal and a method of manufacturing the same.

BACKGROUND

FinFET generally refers to a nonplanar, double-gate transistor. Integrated circuits that include FinFETs may be fabricated on a bulk silicon substrate or, more commonly, on a silicon-on-insulator (SOI) wafer that includes an active SOI layer of a single crystal semiconductor, such as silicon, a semiconductor substrate, and a buried insulator layer, e.g., a buried oxide layer that separates and electrically isolates the semiconductor substrate from the SOI layer. Each FinFET generally includes a narrow vertical fin body of single crystal semiconductor material with vertically-projecting sidewalls. A gate contact or electrode intersects a channel region of the fin body and is isolated electrically from the fin body by a thin gate dielectric layer. At opposite ends of the fin body are heavily-doped source/drain regions. Conventional methods of forming the fin body utilize subtractive techniques in which a uniform thick layer of single crystal silicon is patterned by masking and etching with processes like reactive ion etching (RIE).

In FinFET manufacturing processes, the fins are merged together by a selective epi Si grown around each of the fins. The epi Si growth is critical to the merging of the fins. After the formation of the selective epi Si to merge the fins, a final spacer is formed and a source/drain (S/D) implant is performed though the epi Si to implant the fins with a dopant. A silicide is then formed over the implanted epi Si.

The selective epi Si growth process, though, is difficult to control and hence is unstable. Because of this difficulty, the epi Si may grow to different thicknesses on individual fins on the same wafer or between processing runs of different wafers, for example. Thus, this inconsistent growth can result in the epi Si being thicker or thinner than designed thus leading to device degradation. For example, when the epi is too thick, the dopant may not reach the fin, itself, or be at a lower than desirable level, resulting in high resistance. This high resistance, of course, degrades the device performance. On the other hand, when the epi Si is too thin, the implant will amorphize or damage the fin. In this case, the annealing process will not crystallize the fin and resistance will remain high. Again, this high resistance degrades device performance. Furthermore, as diameter of the Fin, DFin, approaches to approximately 6 nm as gate scaling demands for future nodes, selective epi merging technique may not be possible.

Accordingly, there exists a need in the art to overcome the deficiencies and limitations described hereinabove.

SUMMARY

In a first aspect of the invention, a method comprises forming a plurality of fin bodies on a substrate and merging the fin bodies with a metal. The method further comprises implanting source and drain regions through the metal.

In another aspect of the invention, a method comprises forming a plurality of FinFETs and doping the plurality of FinFETs. The method further comprises preparing the surface of the plurality of FinFETs for a metal and performing a metal deposition process to merge the plurality of FinFETs with the metal. The method further comprises doping source and drain regions through the metal.

In yet another aspect of the invention, a structure comprises a plurality of FinFETs merged together with a metal.

In a further aspect of the invention, a design structure for forming FinFETs is embodied in a machine-readable medium for designing, manufacturing, or testing an integrated circuit. The design structure comprising a program module configured to form a plurality of FinFETs, the program module: forms plurality of fin bodies on a substrate; merges the fin bodies with a metal; and implants source and drain regions through the metal.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

FIG. 1b shows a cross sectional view of the structure of FIG. 1a;

FIGS. 3b and 3c show cross sectional views of the structure of FIG. 3a; and

DETAILED DESCRIPTION

The invention relates to FinFETs and a method manufacture, and more particularly, to FinFETs merged with a metal and a method of manufacturing the same. More specifically, the present invention is directed to FinFET structures, which have reduced contact resistance compared to FinFETs formed using conventional epi FinFET source/drain processes. In particular, the present invention eliminates unstable epitaxial growth of Si on the fin body which leads to high resistance and degradation in device performance. Instead, the present invention merges the fin bodies through chemical vapor deposition (CVD) of metal directly on the FinFETs. Advantageously, the metal has a conductivity that is not dependent on thickness, which ensures more stable processes, eliminates high resistance of epi and, hence, does not lead to degradation of device performance.

Figure 1A:
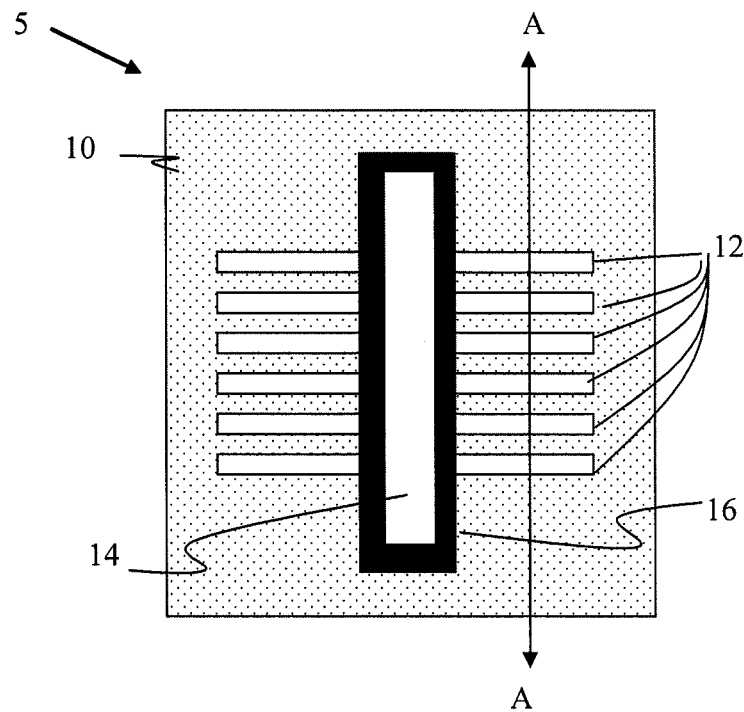
FIG. 1a shows a top view of a beginning structure in accordance with the invention.
Figure 1B:
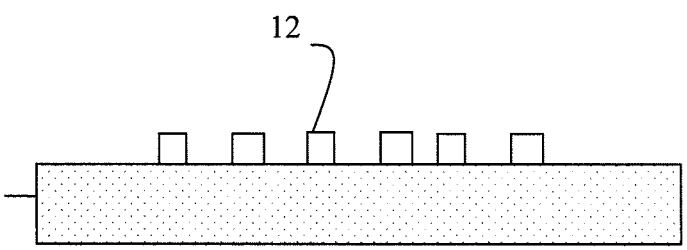

FIG. 1a shows a top view of a beginning structure and FIG. 1b shows a cross sectional view of the structure of FIG. 1a. More specifically, the structure 5 includes a substrate 10 such as, for example, BOX, SOI, $AlO_2$ or any other suitable substrate. In embodiments, the substrate 10 can be bulk silicon substrate or, more commonly, a silicon-on-insulator (SOI) wafer that includes an active SOI layer of a single crystal semiconductor, such as silicon, a semiconductor substrate, and a buried insulator layer, e.g., a buried oxide layer that separates and electrically isolates the semiconductor substrate from the SOI layer.

A plurality of FinFETs (fin bodies) 12 is formed on the substrate 10 using conventional processes. In embodiments, the fin bodies 12 are narrow vertical fin bodies of single crystal semiconductor material with vertically-projecting sidewalls. In an example of the formation process, the fin bodies 12 may be processed either by optical or e-beam lithographic processes in combination with trimming processes such as, for example, resist trimming, hard mask trimming or oxidation trimming. Another method of trimming utilized by the present invention is sidewall image transfer (SIT) process, which provides very high-density structures that are independent of lithographic resolution and pitch. As should be known to those of skill in the art, the SIT process is based upon a spacer that is formed on the sidewall of an optical defined structure, where the spacer is used as a mask to define the structure of the underlying layer or layers. Other methods of forming the fin are also contemplated by the present invention such as, for example, as disclosed in U.S. Pat. No. 7,470,570 which is assigned to International Business Machines, Corp. U.S. Pat. No. 7,470,570 is incorporated by reference herein in its entirety.

Still referring to FIGS. 1a and 1b, a gate 14 is formed over the fin bodies 12 using conventional deposition, lithographic and etching processes. In embodiments, the gate 14 is a poly or metal gate that intersects a channel region of the fin bodies and is isolated electrically from the fin bodies by a thin gate dielectric layer, e.g., spacer 16. The spacer 16, must be resistant to HF etching, is deposited on the sidewalls of the gate 14 using conventional deposition processes. In embodiments, the spacer 16 is oxide, but can also be nitride or other dielectric materials. At opposite ends of the fin bodies are heavily-doped source/drain regions.

Figure 2A:
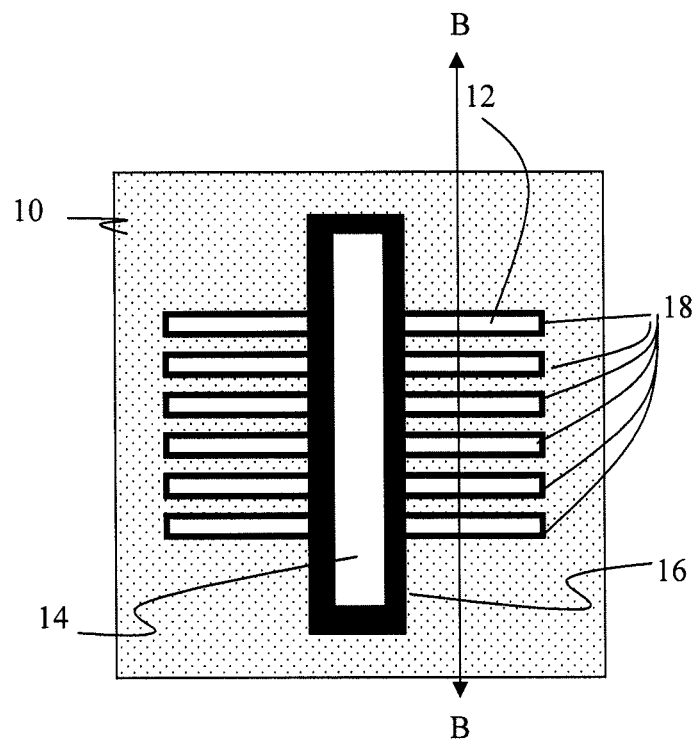
FIG. 2a shows a top view of an intermediate structure in accordance with the invention.
Figure 2B:
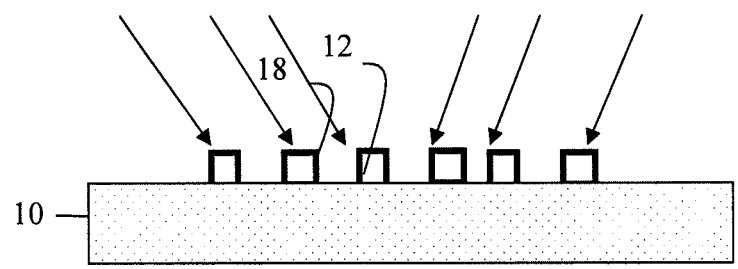
FIG. 2b shows a cross sectional view of the structure of FIG. 2b.

Referring to FIGS. 2a and 2b, the fin bodies 12 undergo an implantation processes as represented by the arrows in FIG. 2b. The implantation process includes implanting a dopant such as, nFET and pFET extension, as well as NFET and pFET halos. More specifically, the nFET extension can be, for example, As (1 keV to 6 keV) or P (0.5 keV to 3 keV), at a dosage of about 2e15+/−2e15 and tilt angle of about 0-20 degrees. The pFET extension can be, for example, B (0.5 keV to 2 keV) or $BF_2$ (2 keV to 6 keV), at a dosage of 2e15+/−2e15 and tilt angle of about 0-20 degrees. The nFET halo can be B (5 keV to 10 keV) or $BF_2$ (30 keV to 50 keV), at a dosage of about 4e13+/−2e13 and a tilt angle of about 10 to 30 degrees. The pFET halo can be, for example, As (30 keV to 50 keV) at a dosage of about 3e13+/−1e13 and a tilt angle of about 10 to 30 degrees. The structure then undergoes an activation annealing process. After the annealing process, the fin bodies 12 undergo an optional pre-silicide clean process using, for example, dilute HF.

Still referring to FIGS. 2a and 2b, a metal deposition process is performed on the fin bodies 12. In particular, a CVD metal deposition process is performed to form a silicide 18 directly on the fin bodies 12. In embodiments, the metal may be tungsten or cobalt; although other metals are also contemplated by the present invention such as, for example, nickel. The metal 18 may be deposited to a depth of about 10 nm to about 20 nm; although other dimensions are also contemplated by the invention.

A silicidation anneal (e.g., rapid thermal anneal (RTA)) is performed at a temperature of about 300° C. to about 500° C. After the silicide process, the spacing between the fin bodies 12 is about 30 nm to about 60 nm; although other dimensions are also contemplated by the present invention. As should be understood by those of skill in the art, the silicide will provide a transition (superior contact area) between the fin bodies 12 and a subsequently deposited metal.

Figure 3A:
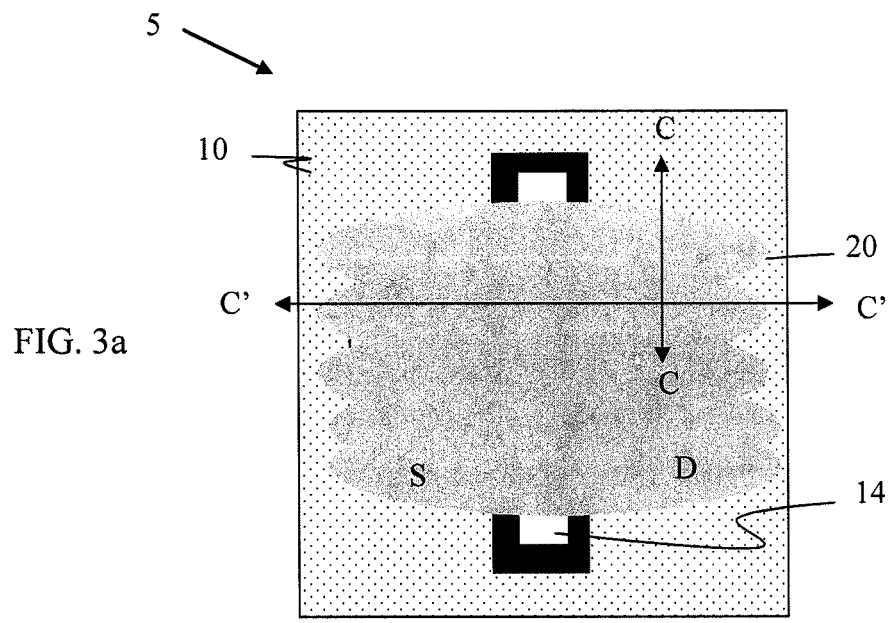
FIG. 3a shows a top view of a final structure in accordance with the invention.
Figure 3B:
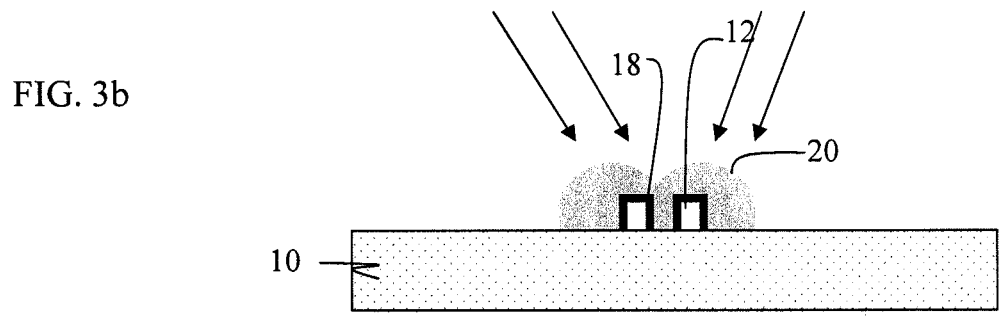
Figure 3C:
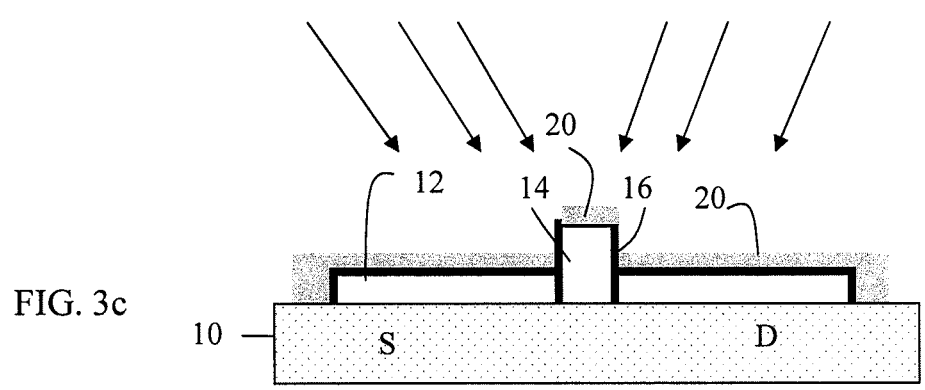

FIG. 3a shows a top view of a final structure in accordance with the invention; whereas, FIGS. 3b and 3c show cross sectional views of the structure of FIG. 3a. In particular, FIG. 3b is a cross sectional view along line C-C of FIG. 3a, and FIG. 3c is a cross sectional view along line C'-C' of FIG. 3a. Prior to further processing, the fin bodies 12 may undergo an optional pre-metal clean using, for example, a dilute HF.

In embodiments, a metal deposition process is performed to merge the fin bodies 12. Specifically, using a conventional CVD process, metal 20 is deposited on the fin bodies 12 and gate structure 14. In embodiments, the CVD is selective to the silicided fin bodies 12. The metal 20 may be, for example, tungsten or aluminum; although other metals such as, for example, nickel, are also contemplated by the present invention. Metals such as, for example, aluminum have a very low sheet resistance, which improves overall device performance. The structure then undergoes an optional annealing process to reflow the metal.

In embodiments, the metal 20 is deposited to such a thickness that the fin bodies 12 become merged. To accomplish this merge, the thickness of the deposited metal can be, for example, about 30 nm to 60 nm; although other dimensions are contemplated by the present invention depending on the spacing between the fin bodies 12. For example, any thickness that merges the fins 12 together can be used with the present invention. Advantageously, conductivity of the metal is not dependent on the thickness and, as such, the deposition of metal on the structure will not degrade device performance.

As shown by the arrows in FIGS. 3b and 3c, the fin bodies 12 undergo a source drain (S/D) implantation. For example, the S/D implant may be, for an nFET SD, As (10 keV to 30 keV) or P (5 keV to 15 keV) at a dosage of about 3e15+/−1e15 and a tilt angle of about 0-10 degrees. The S/D implant for a pFET may be, for example, B (1 keV to 3 keV) or $BF_2$ (10 keV to 50 keV), at a dosage of about 3e15+/−1e15 and a tilt angle of about 0-10 degrees. Advantageously, the metal has a conductivity that is not dependent on thickness, which ensures more stable processes, eliminates high resistance of epi and, hence, does not lead to degradation of device performance.

Design Structure

Figure 4:
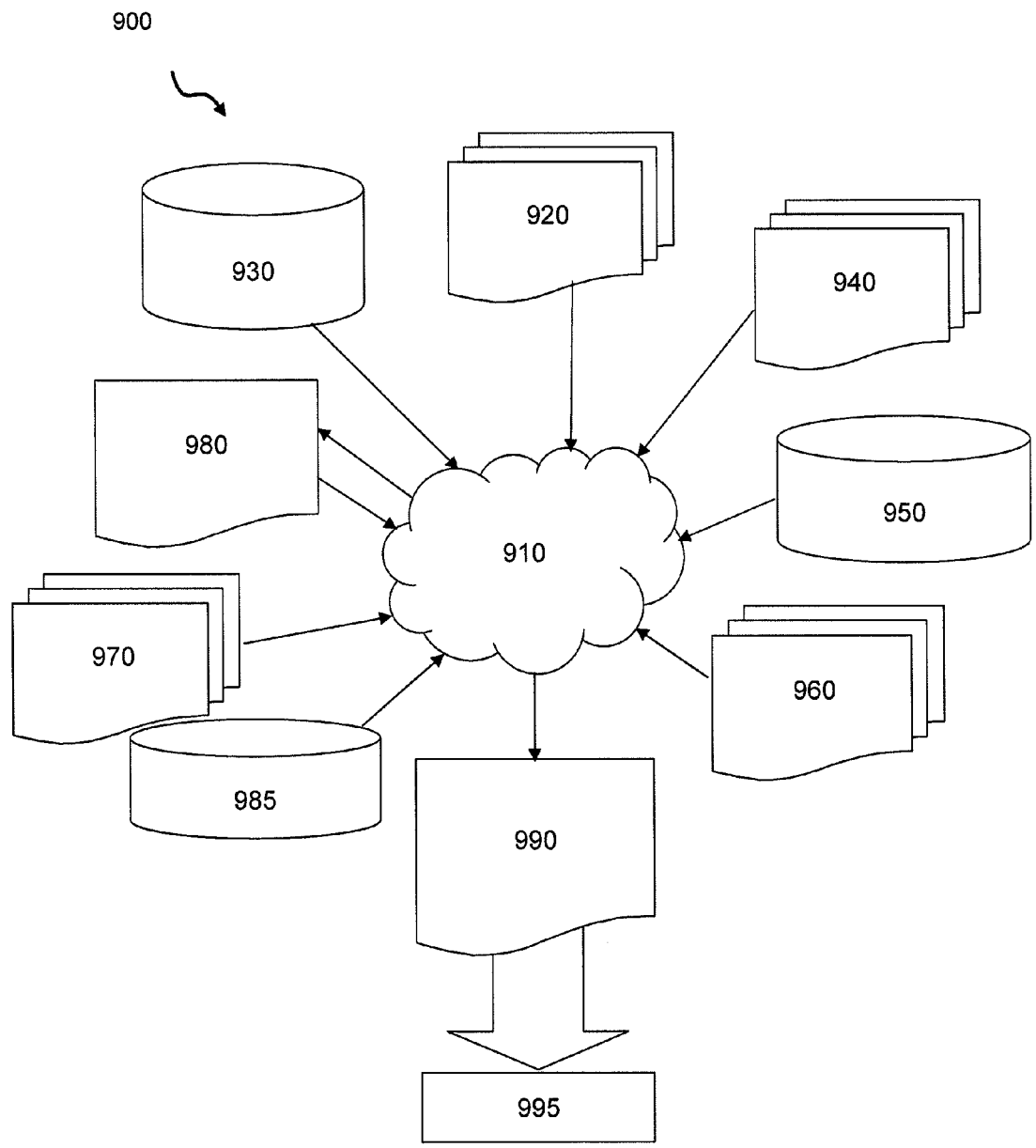
FIG. 4 is a flow diagram of a design process used in semiconductor design, manufacture, and/or test.

FIG. 4 shows a block diagram of an exemplary design flow 900 used for example, in semiconductor design, manufacturing, and/or test. Design flow 900 may vary depending on the type of IC being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Alter® Inc. or Xilinx® Inc. Design structure 920 is preferably an input to a design process 910 and may come from an IP provider, a core developer, or other design company or may be generated by the operator of the design flow, or from other sources. Design structure 920 comprises an embodiment of the invention as shown in FIGS. 1a-3c in the form of schematics or HDL, a hardware-description language (e.g., Virology, VHDL, C, etc.). Design structure 920 may be contained on one or more machine-readable media. For example, design structure 920 may be a text file or a graphical representation of an embodiment of the invention as shown in FIGS. 1a-3c. Design process 910 preferably synthesizes (or translates) embodiments of the invention as shown in FIGS. 1a-3c into a net list 980, where net list 980 is, for example, a list of wires, transistors, logic gates, control circuits, I/O, models, etc. that describes the connections to other elements and circuits in an integrated circuit design and recorded on at least one of machine readable media. For example, the medium may be a CD, a compact flash, other flash memory, a packet of data to be sent via the Internet, or other networking suitable means. The synthesis may be an iterative process in which net list 980 is resynthesized one or more times depending on design specifications and parameters for the circuit.

Design process 910 may include using a variety of inputs; for example, inputs from library elements 930 which may house a set of commonly used elements, circuits, and devices, including models, layouts, and symbolic representations, for a given manufacturing technology (e.g., different technology nodes, 32 nm, 45 nm, 90 nm, etc.), design specifications 940, characterization data 950, verification data 960, design rules 970, and test data files 985 (which may include test patterns and other testing information). Design process 910 may further include, for example, standard circuit design processes such as timing analysis, verification, design rule checking, place and route operations, etc. One of ordinary skill in the art of integrated circuit design can appreciate the extent of possible electronic design automation tools and applications used in design process 910 without deviating from the scope and spirit of the invention. The design structure of the invention is not limited to any specific design flow.

Design process 910 preferably translates an embodiment of the invention as shown in FIGS. 1a-3c, along with any additional integrated circuit design or data (if applicable), into a second design structure 990. Design structure 990 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 990 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce embodiments of the invention as shown in FIGS. 1a-3c. Design structure 990 may then proceed to a stage 995 where, for example, design structure 990: proceeds to tape-out, is released to manufacturing, is released to a mask house, is sent to another design house, is sent back to the customer, etc.

The methods as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A method comprising:
forming a plurality of fin bodies on a substrate;
forming a gate structure over the plurality of fin bodies;
depositing a layer of metal on the fin bodies;
annealing the layer of metal to form silicide;
merging the fin bodies with a metal by depositing the metal on the plurality of fin bodies and the gate structure, wherein the metal is in electrical contact with the gate structure; and
implanting source and drain regions through the metal, wherein the annealing is performed prior to the merging.

2. The method of claim 1, wherein the depositing is a chemical vapor deposition process.

3. The method of claim 1, wherein the metal is one of aluminum, tungsten and nickel.

4. The method of claim 1, further comprising implanting dopant into the fin bodies prior to the merging step.

5. The method of claim 1, wherein the layer of metal includes one of nickel, cobalt, and tungsten.

6. The method of claim 1, wherein the fin bodies are doped Si.

7. The method of claim 1, wherein the metal is deposited selectively on the fin bodies.

8. A method comprising:
forming a plurality of FinFETs comprising a substrate, a plurality of fin bodies, and a gate formed over the plurality of fin bodies;
doping the plurality of FinFETs;
preparing the surface of the plurality of FinFETs for a metal;
depositing a layer of metal on the surface of the plurality of fin bodies;
annealing the layer of metal to form silicide;
performing a metal deposition process to merge the plurality of FinFETs with the metal, wherein the metal deposition process includes depositing the metal on the substrate, the plurality of fin bodies and the gate to such a thickness that the metal fills each gap between the plurality of fin bodies completing physical contact between each fin body, the substrate and the gate; and
doping source and drain regions through the metal,
wherein the metal deposition process is selective to the silicide formed on the plurality of fin bodies; and
the annealing the layer of metal is performed prior to the performing the metal deposition process.

9. The method of claim 8, wherein the layer of metal is one of tungsten, cobalt and nickel.

10. The method of claim 8, wherein the preparing the surface of the plurality of FinFETs comprises a pre-silicide clean.

11. The method of claim 8, wherein the metal deposition process is a chemical vapor deposition.

12. The method of claim 8, further comprising reflowing the metal.

13. The method of claim 8, further comprising doping the plurality of FinFETs prior to the depositing the layer of metal.

14. A design structure embodied in a machine readable medium for designing, manufacturing, or testing an integrated circuit, the design structure comprising a program module configured to form a plurality of FinFETs, the program module:
- forms plurality of fin bodies on a substrate;
- forms a gate structure over the plurality of fin bodies;
- forms a layer of metal on the plurality of fin bodies;
- anneals the layer of metal to form silicide;
- merges the fin bodies with a metal by depositing the metal on the plurality of fin bodies and the gate structure, wherein the metal is in electrical contact with the gate structure; and
- implants source and drain regions through the metal, wherein the annealing is performed prior to the merging.

15. The design structure of claim 14, wherein the design structure resides on storage medium as a data format used for the exchange of layout data of integrated circuits.

16. The design structure of claim 14, wherein the layer of metal includes one of nickel, cobalt, and tungsten.

17. A method comprising:
- forming a plurality of fin bodies on a substrate;
- forming a gate structure over the plurality of fin bodies; and
- merging the fin bodies with a metal by depositing the metal on the plurality of fin bodies and the gate structure, wherein the metal is in electrical contact with the gate structure; and implanting source and drain regions through the metal, wherein:
- the gate is formed from poly or metal that intersects a channel region of the plurality of fin bodies and is isolated electrically from the plurality of fin bodies by a gate dielectric layer;
- a spacer is deposited on sidewalls of the gate;
- the spacer is resistant to HF etching;
- the plurality of fin bodies undergo:
  - an implantation process which includes implanting an extension dopant and halo dopant; and
  - an activation annealing process; and
- after the activation annealing process, the plurality of fin bodies undergo a pre-silicide clean process using dilute HF.

18. The method of claim 17, further comprising:
- forming a silicide on the plurality of fin bodies, the silicide being formed by:
  - deposited a metal directly on the plurality of fin bodies to a depth of about 10 nm to about 20 nm, the depositing being a chemical vapor deposition process; and
  - performing a rapid thermal anneal at a temperature of about 300° C. to about 500° C., wherein:
- after the silicide process, a spacing between the plurality of fin bodies is about 30 nm to about 60 nm;
- prior to further processing, the plurality of fin bodies undergo a pre-metal clean using dilute HF;
- the metal deposition process is performed using chemical vapor deposition to deposit the metal on the plurality of the fin bodies and the gate to a thickness of the spacing between the plurality of fin bodies, wherein the chemical vapor deposition is selective to the silicided fin bodies; and
- performing an annealing process to reflow the metal used in the metal deposition process.

* * * * *